(12) United States Patent
Inui et al.

(10) Patent No.: US 7,286,170 B2
(45) Date of Patent: Oct. 23, 2007

(54) SOLID-STATE IMAGE SENSOR, CAMERA USING THE SAME, CAMERA CONTROL SYSTEM, AND SIGNAL OUTPUT DEVICE

(75) Inventors: Fumihiro Inui, Kanagawa (JP); Tetsuya Itano, Tokyo (JP); Masanori Ogura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 737 days.

(21) Appl. No.: 10/693,455

(22) Filed: Oct. 27, 2003

(65) Prior Publication Data

US 2004/0085465 A1    May 6, 2004

(30) Foreign Application Priority Data

Oct. 31, 2002    (JP)    ............... 2002-318457

(51) Int. Cl.
   *H04N 5/217*   (2006.01)
(52) U.S. Cl. ............... 348/241; 348/302; 348/300
(58) Field of Classification Search ............... 348/308, 348/302, 301, 303, 304, 305, 312, 314, 316, 348/241; 358/3.26, 482, 447, 463; 257/223, 257/224; 250/208.1
   See application file for complete search history.

(56) References Cited

U.S. PATENT DOCUMENTS

| | | | |
|---|---|---|---|
| 4,634,886 A * | 1/1987 | Hatanaka et al. ............ | 358/482 |
| 4,768,098 A * | 8/1988 | Vogelsong ................... | 348/306 |
| 4,914,519 A | 4/1990 | Hashimoto et al. ..... | 358/213.18 |
| 5,019,702 A | 5/1991 | Ohzu et al. ............... | 250/208.1 |
| 5,311,320 A | 5/1994 | Hashimoto ................. | 348/243 |
| 5,737,016 A | 4/1998 | Ohzu et al. ................. | 348/241 |
| 5,771,070 A | 6/1998 | Ohzu et al. ................. | 348/241 |
| 6,650,369 B2 * | 11/2003 | Koizumi et al. ............ | 348/301 |
| 6,977,684 B1 * | 12/2005 | Hashimoto et al. ........ | 348/294 |
| 7,148,927 B2 * | 12/2006 | Ogura et al. ................ | 348/281 |
| 2002/0051071 A1 | 5/2002 | Itano et al. ................. | 348/340 |

FOREIGN PATENT DOCUMENTS

JP    9-246517    9/1997

\* cited by examiner

*Primary Examiner*—Vivek Srivastava
*Assistant Examiner*—Nelson D. Hernandez
(74) *Attorney, Agent, or Firm*—Fitzpatrick, Cella, Harper & Scinto

(57) ABSTRACT

A solid-state image sensor has a sensor array that includes an array of pixel cells. The solid-state image sensor sequentially selects one line from plural lines of the sensor array and sequentially reads out signal charge and reset levels of pixel photosensor cells belonging to the selected line via first and second optical-signal common output lines and first and second noise-signal common output lines. Differential signals are amplified and output via signal less noise (S-N) read-out circuits. The optical-signal and the noise-signal common output lines are arranged parallel to one another in the sequence of the first optical-signal common output line, the first noise-signal common output line, the second noise-signal common output line, and the second optical-signal common output line. The solid stage image sensor may be used in a camera and in a camera control system.

12 Claims, 9 Drawing Sheets

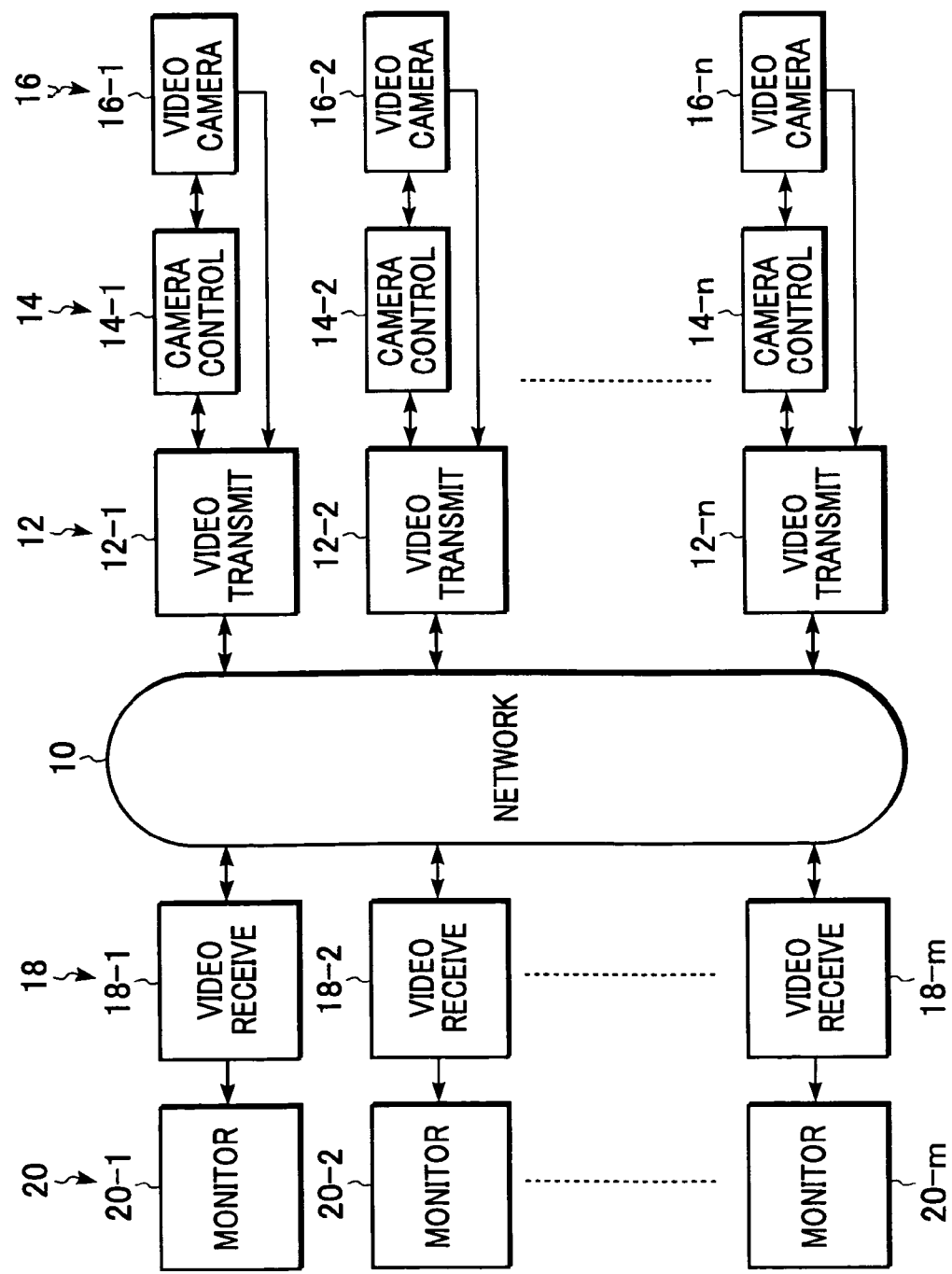

SOLID-STATE IMAGE SENSOR, CAMERA USING THE SAME, CAMERA CONTROL SYSTEM, AND SIGNAL OUTPUT DEVICE

BACKGROUND OF THE INVENTION

1. Field of the Invention

The present invention relates to a solid-state image sensor for sequentially reading out, from one line of a sensor array including an array of pixel photosensor cells or from one of a plurality of lines, which is selected in sequence from the sensor array, signal charge (S) and reset level (N) of the pixel photosensor cells via optical-signal common output lines and noise-signal common output lines and for amplifying and outputting differential signals and further relates to a camera using such a solid-state image sensor and to a camera control system.

The present invention further relates to a signal output device for outputting, from each of plural signal sources, a first signal and a second signal that has a level lower than that of the first signal, reading out the first signals and the second signals via first-signal common output lines and second-signal common output lines, and outputting differential signals between the first signals and the second signals output from the corresponding signal sources.

2. Description of the Related Art

Solid-state image sensors are broadly classified into charge-coupled device (CCD) sensors and metal-oxide semiconductor (MOS) sensors. In general, CCD sensors are advantageous over MOS sensors in that the CCD sensors have less noise, though the CCD sensors are disadvantageous in that their power consumption is large. In contrast, MOS sensors are advantageous over CCD sensors in that the MOS sensors have much smaller power consumption than that of the CCD sensors, though the MOS sensors generally have slightly larger noise. Since the noise in MOS sensors has recently been reduced, it is expected that MOS sensors will achieve a performance equal to or better than that of CCD sensors.

It is relatively easy to provide an MOS sensor with various built-in functional circuits using MOS transistors. As shown in FIG. 7 of Japanese Patent Laid-Open No. 9-246517, performance improvement, such as an increase in processing speed, is achieved by incorporating a plurality of read-out circuits in the MOS sensor.

FIG. 6 schematically shows the configuration of a known MOS sensor. This MOS sensor includes a sensor array 100 including a two-dimensional array of a plurality of pixel photosensor cells 110; a vertical shift register circuit 120 that sequentially selects one row of the pixel photosensor cells 110 from the sensor array 100; line memory circuits 130, each line memory circuit 130 including a signal charge holding capacitor Cts holding signal charge (S) serving as an optical signal and a reset level holding capacitor Ctn holding reset level (N) serving as a noise signal of the corresponding pixel photosensor cell 110 belonging to the selected row; a horizontal shift register circuit 140 that simultaneously selects, using a transfer switch, two pieces of the signal data held in the line memory circuits 130, the signal data being associated with the selected one row, and transfers the selected two pieces of signal data to a first optical-signal common output line (hereinafter referred to as a first S output line) 210 and a first noise-signal common output line (hereinafter referred to as a first N output line) 220 and to a second optical-signal common output line (hereinafter referred to as a second S output line) 230 and a second noise-signal common output line (hereinafter referred to as a second N output line) 240, respectively; and first and second differential-signal (S-N) read-out circuits 150 that amplify and output a first differential signal between an optical signal from the first S output line 210 and a noise signal from the first N output line 220 and a second differential signal between an optical signal from the second S output line 230 and a noise signal from the second N output line 240, respectively.

The first differential signal is output from an output terminal (out1) 170 of the first differential-signal read-out circuit 150, and the second differential signal is output from an output terminal (out2) 180 of the second differential-signal read-output circuit 150. The first S output line 210, the first N output line 220, the second S output line 230, and the second N output line 240 are included in common output lines 160.

In the known MOS sensor shown in FIG. 6, the signal read-out from each line memory circuit 130 to the common output lines 160 is carried out in accordance with a gain determined by a capacitance splitting ratio (Ct/(Ct/Ch)) between a hold capacitance Ct included in the line memory 130 and a capacitance Ch including a wiring capacitance between the common output lines 160 and, primarily, ground, a capacitance between the source and the gate of a MOS switch connected to the common output lines 160, and a capacitance between the source and the backgate of the MOS switch. In other words, the signal charge (S) is read out at the optical-signal common output line in accordance with the gain determined by the capacitance splitting ratio; and the reset level (N) is read out at the noise-signal common output line in accordance with the gain determined by the capacitance splitting ratio. The differential signal between the signal charge (S) and the reset level (N) is output. This differential signal is expressed as A×(Vs×Cts/(Cts+Chs)−Vn×Ctn/(Ctn+Chn)) where A denotes the amplification factor of an amplifier; Vs denotes the optical signal level accumulated in the holding capacitor Cts; and Vn denotes the reset level accumulated in the holding capacitor Ctn.

FIG. 7 is a diagram showing the longitudinal structure of a portion including the common output lines 160 taken along line VII-VII of FIG. 6 showing the known MOS sensor. The first S output line 210, the first N output line 220, the second S output line 230, and the second N output line 240 are arranged, as shown in FIG. 7, in the sequence: the first S output line 210, the first N output line 220, the second S output line 230, and the second N output line 240. Referring to FIG. 7, Ch1s denotes the capacitance of the first optical-signal common output line 210 (hereinafter referred to as the first S output line capacitance); Ch1n denotes the capacitance of the first noise-signal common output line 220 (hereinafter referred to as the first N output line capacitance); Ch2s denotes the capacitance of the second optical-signal common output line 230 (hereinafter referred to as the second S output line capacitance); and Ch2n denotes the capacitance of the second noise-signal common output line 240 (hereinafter referred to as the second N output line capacitance).

In the known MOS sensor shown in FIGS. 6 and 7, the common output lines 160 are arranged in the sequence: the first S output line 210, the first N output line 220, the second S output line 230, and the second N output line 240. Due to a coupling capacitance Cp 250 formed between the first N output line 220 and the second S output line 230, crosstalk is induced between the S-N read-out circuits 150 in opposite directions, resulting in differences in gain, offset, etc. between the S-N read-out circuits 150. These differences in gain, offset, etc. may cause problems.

To describe these problems, FIG. 8 shows an equivalent circuit of a portion of the common output lines 160. FIG. 8 shows a coupling capacitance Cp 310, a first reset level holding capacitor Ct1n 320, a transfer switch (SW) 330, a first N output line capacitance Ch1n 340, and a second S output line capacitance Ch2s 350. The connection between the first reset level holding capacitor Ct1n 320 and the transfer switch 330 has a potential of Vct1n. The connection between the transfer switch 330 and the coupling capacitance Cp 310 has a potential of Vch1n. The connection between the coupling capacitance Cp 310 and the second S output line capacitance Ch2s 350 has a potential of Vch2s.

Due to the crosstalk, charge is injected from the first N output line 220 into the second S output line 230 via the coupling capacitance Cp 310. The state prior to read-out is defined as time t=0, and the time at which the transfer switch SW 330 is activated to start read-out at the common output lines 160 is defined as t=t1. The potentials of the connections at each time are defined as Vct1n (t=0)=Va, Vch1n (t=0)=0, and Vch2s (t=0)=0; and Vct1n (t=t1)=Vch1n (t=t1)=Vb, and Vch2s (t=t1)=Vc. This yields:

$$Vb = \frac{Ct1n}{Ct1n + Ch1n + \frac{Cp \times Ch2s}{Cp \times Ch2s}} Va \quad (1)$$

$$Vc = \frac{Cp}{Ch2s + Cp} Vb \quad (2)$$

In equations (1) and (2), if Ch2s=Ch1n and Cp=αCh1n, then $$Vc = \frac{Cp}{Ch1n + Cp} \times \frac{Ct1n}{Ct1n + Ch1n + \frac{Cp \times Ch1n}{Cp + Ch1n}} \times Va \quad (3)$$

$$= \frac{\alpha}{1+\alpha} \times \frac{Ct1n}{Ct1n + \frac{1+2\alpha}{1+\alpha} \times Ch1n} \times Va$$

If Ct1n, Ch1n>>α, the following approximations are derived:

$$\frac{\alpha}{1+\alpha} \approx \alpha, \quad \frac{1+2\alpha}{1+\alpha} \approx 1 \quad (4)$$

Thus, $$Vc = \alpha \times \frac{Ct1n}{Ct1n + Ch1n} \times Va \quad (5)$$

In other words, charge is injected into the coupling capacitance Cp, which is α times Ch1n, in accordance with the gain determined by the capacitance splitting ratio between Ct and Ch.

Similarly, due to the crosstalk, charge is injected from the second S output line 230 into the first N output line 220. The potentials of the connections at each time are defined as Vct2s (t=0)=Va', Vch2s (t=0)=0, and Vch1n (t=0)=0; and Vct2s (t=t1)=Vch2s (t=t1)=Vb', and Vch1n (t=t1)=Vc'. This yields:

$$Vc' = \alpha \times \frac{Ct2s}{Ct2s + Ch2s} \times Va' \quad (6)$$

At the output terminals 170 and 180, output voltages Vout1 and Vout2 are generated by amplifying the differential signals. These output voltages Vout1 and Vout2 will now be described. To design satisfactory S-N read-out circuits, it is important that Cts=Ctn and Chs=Chn. Assuming that Ct1s=Ct1n=Ct2s=Ct2n=Ct, Ch1s=Ch1n=Ch2s=Ch2n=Ch, and the potentials of the connections when t=0 are Vct1s (t=0)=V1s, Vct1n (t=0)=V1n, Vct2s (t=0)=V2s, and Vct2n (t=0)=V2n, then Vout1 and Vout2 are estimated as:

$$Vout1 = A \times \left( \frac{Ct1s}{Ct1s + Ch1s} \times V1s - \left( \frac{Ct1n}{Ct1n + Ch1n} \times V1n + \alpha \times \frac{Ct2s}{Ct2s + Ch2s} \times V2s \right) \right) \quad (7)$$

$$= A \times \frac{Ct}{Ct + Ch} \times (V1s - (V1n + \alpha \times V2s))$$

$$Vout2 = A \times \left( \frac{Ct2s}{Ct2s + Ch2s} \times V2s + \alpha \times \frac{Ct1n}{Ct1n + Ch1n} \times V1n - \frac{Ct2n}{Ct2n + Ch2n} \times V2n \right)$$

$$= A \times \frac{Ct}{Ct + Ch} \times ((V2 + \alpha \times V1n) - V2n)$$

The coupling capacitance Cp 250 formed between the two common output lines Ch1n 220 and Ch2s 230 generates the crosstalk between the S-N read-out circuits 150 in opposite directions. As a result, the gain difference, the offset difference, etc. are induced between the S-N read-out circuits 150. In other words, equations (7) show that Vout1 induces crosstalk in the negative direction, which is expressed as A×(Ct/(Ct+Ch))×(−α×V2s), and Vout2 induces crosstalk in the positive direction, which is expressed as A×(Ct/(Ct+Ch))×(α×V1n).

To alleviate the crosstalk between the S-N read-out circuits 150, (1) a large wiring distance is allowed between the common output lines 160, and (2) shield lines to which a ground potential is supplied are disposed between the common output lines 160. However, (1) the wiring region of the common output lines 160 becomes large, resulting in an increase in the chip size; and (2) the gain determined by the capacitance splitting ratio between Ct and Cn is reduced, resulting in reduction of the signal level and relative degradation of the S/N ratio.

SUMMARY OF THE INVENTION

In view of the above-described background, it is an object of the present invention to reduce noise in a solid-state image sensor without increasing the chip size and/or to reduce noise in the solid-state image sensor without reducing the signal level.

According to an aspect of the present invention, a solid-state image sensor is provided. The solid-state image sensor outputs, from one line of a sensor array including an array of pixel photosensor cells or from one of a plurality of lines, which is selected in sequence from the sensor array including the array of the pixel photosensor cells, an optical signal and a noise signal from each of the pixel photosensor cells, separately reads out the output optical signals and the noise signals at n optical-signal common output lines and n noise-signal common output lines (where n is a natural number greater than or equal to 2), and outputs differential signals between the optical signals and the noise signals output from the corresponding pixel photosensor cells by n differential output units, respectively, to which the optical-signal common output lines and the noise-signal common output lines are connected. The n differential output units include a first differential output unit and a second differential output unit. The n optical-signal common output lines and the n noise-signal common output lines are arranged parallel to each other. Of these 2n common output lines, at least four common output lines consisting of a first optical-signal common output line, a first noise-signal common output line, a second optical-signal common output line, and a second noise-signal common output line are arranged in the sequence: the first optical-signal common output line, the first noise-signal common output line, the second noise-signal common output line, and the second optical-signal common output line. The first optical-signal common output line and the first noise-signal common output line are connected to the first differential output unit, and the second optical-signal common output line and the second noise-signal common output line are connected to the second differential output unit.

A shield line to which a fixed potential is supplied may be arranged in the same layer as the 2n common output lines. Of the 2n common output lines, the shield line may be arranged between the adjacent noise-signal common output lines, between the adjacent optical-signal common output and the noise-signal common output lines, or outside of the 2n common output lines.

In the solid-state image sensor, n may be 2. A shield line to which a fixed potential is supplied may be arranged in the same layer as the four common output lines. The shield line may be arranged between the first noise-signal common output line and the second noise-signal common output line, between the first optical-signal common output line and the first noise-signal common output line, between the second noise-signal common output line and the second optical-signal common output line, or outside of the first optical-signal common output line and the second optical-signal common output line.

In the solid-state image sensor, n may be greater than or equal to 3. An optical-signal common output line may be arranged adjacent to at least one side of a section including the first optical-signal common output line, the first noise-signal common output line, the second noise-signal common output line, and the second optical-signal common output line, which are arranged in this sequence. The distance between the optical-signal common output line arranged adjacent to the section and the first or second optical-signal common output line included in the section may be greater than the distance between the optical-signal and the noise-signal common output lines included in the section.

The optical signal and the noise signal read-out timing at the optical-signal common output line and the noise-signal common output line connected to the first differential output unit of the n differential output units may be made to differ from that at the optical-signal common output line and the noise-signal common output line connected to the second differential output unit adjacent to the first differential output unit by shifting the phase between the first differential output unit and the second differential output unit.

The optical signal and the noise signal from each of the pixel photosensor cells of the selected line may be held in an optical-signal holding capacitor and a noise-signal holding capacitor. The optical signals and the noise signals associated with one row, which may be held in the optical-signal holding capacitors and the noise-signal holding capacitors, may be separately read out, via a transfer switch, at the n optical-signal common output lines and the n noise signal common output lines, respectively.

According to another aspect of the present invention, a camera is provided including the above-described solid-state image sensor and a processor that processes an image captured by the solid-state image sensor.

According to a further aspect of the present invention, a camera control system is provided including the above-described solid-state image sensor and a processor that processes an image captured by the solid-state image sensor.

According to yet another aspect of the present invention, an output device is provided. The output device outputs, from each of a plurality of signal sources, a first signal and a second signal that has a level lower than that of the first signal, separately reads out the first signals and the second signals at n first-signal common output lines and n second-signal common output lines (where n is a natural number greater than or equal to 2), and outputs differential signals between the first signals and the second signals output from the corresponding signal sources by n differential output units, respectively, to which the first-signal common output lines and the second-signal common output lines are connected. The differential output units include a first differential output unit and a second differential output unit. The n first-signal common output lines and the n second-signal common output lines are arranged parallel to each other. Of these 2n common output lines, at least four common output lines consisting of a first first-signal common output line, a first second-signal common output line, a second first-signal common output line, and a second second-signal common output line are arranged in the sequence: the first first-signal common output line, the first second-signal common output line, the second second-signal common output line, and the second first-signal common output line. The first first-signal common output line and the first second-signal common output line are connected to the first differential output unit, and the second first-signal common output line and the second second-signal common output line are connected to the second differential output unit.

According to the present invention, noise in a solid-stage image sensor can be reduced without increasing the chip size, and/or noise in the solid-stage image sensor can be reduced without reducing the signal level.

Further objects, features, and advantages of the present invention will become apparent from the following description of the preferred embodiments with reference to the attached drawings.

BRIEF DESCRIPTION OF THE DRAWINGS

FIG. 9 is a block diagram showing the schematic configuration of a camera control system.

DESCRIPTION OF THE PREFERRED EMBODIMENTS

Hereinafter, the preferred embodiments of the present invention will be described with reference to the accompanying drawings.

FIRST EMBODIMENT

Figure 1:
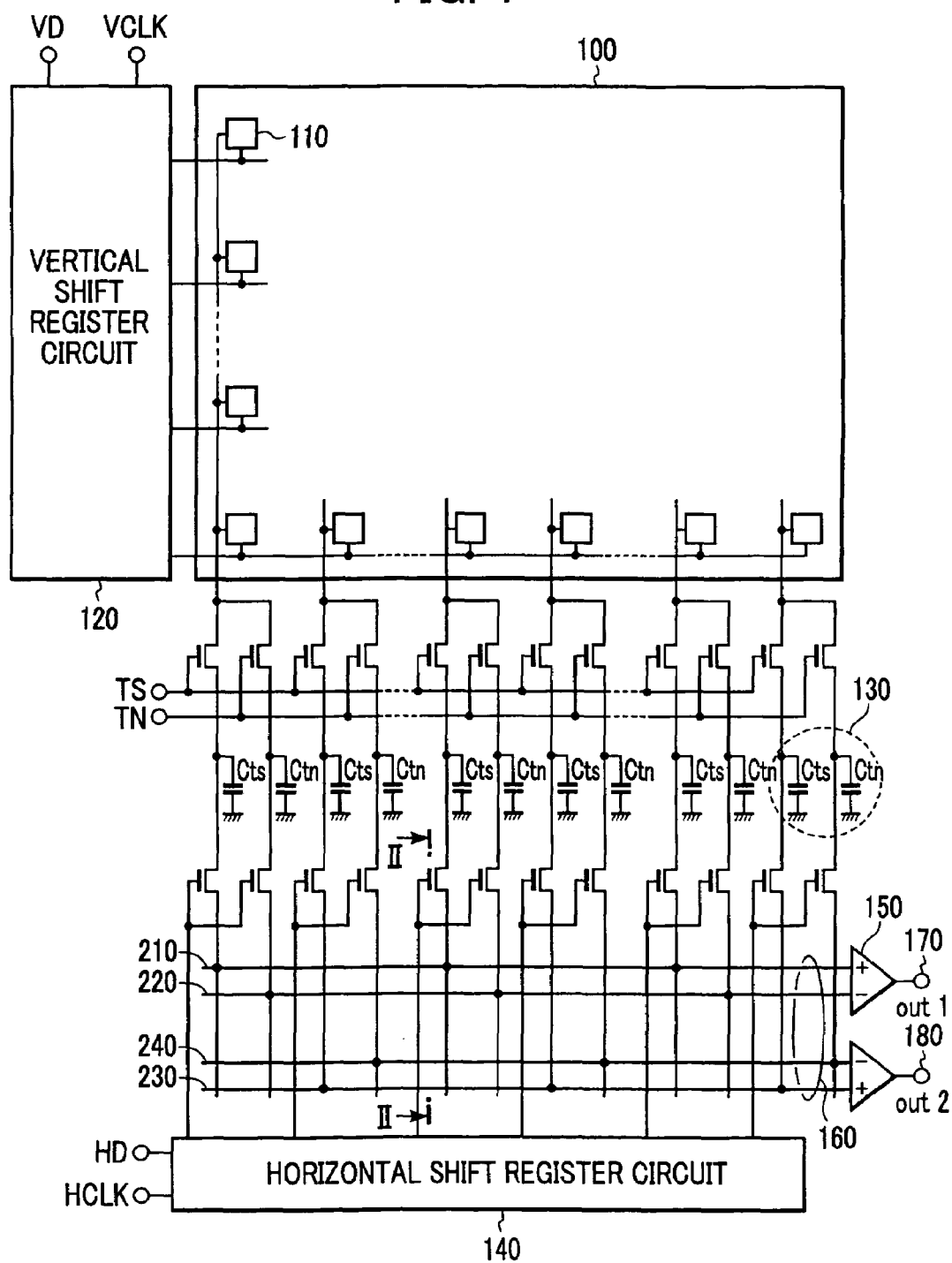
FIG. 1 is a diagram showing the schematic configuration of a MOS sensor according to a first embodiment of the present invention.
Figure 6:
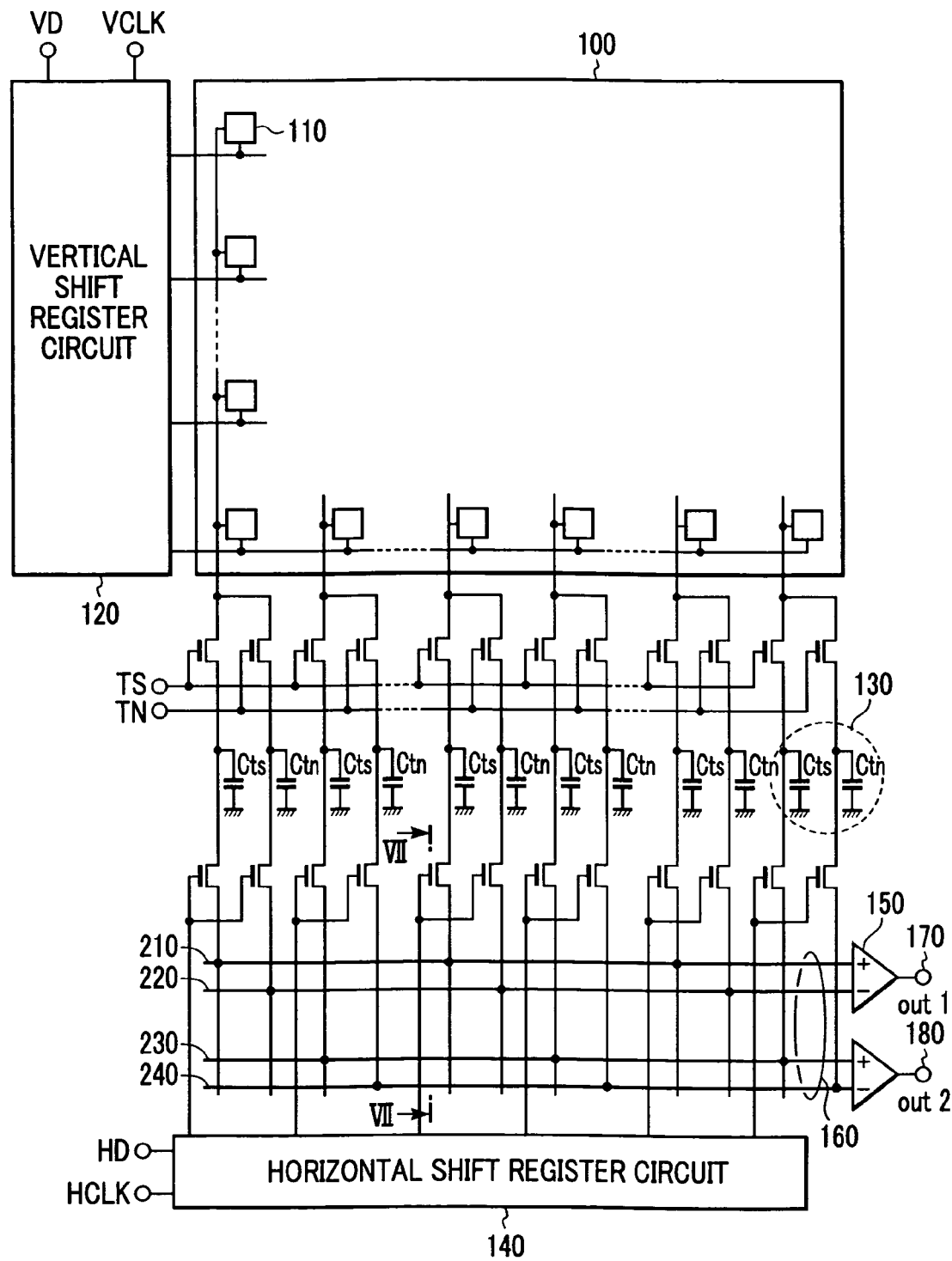
FIG. 6 is a diagram showing the schematic configuration of a known MOS sensor.
Figure 7:
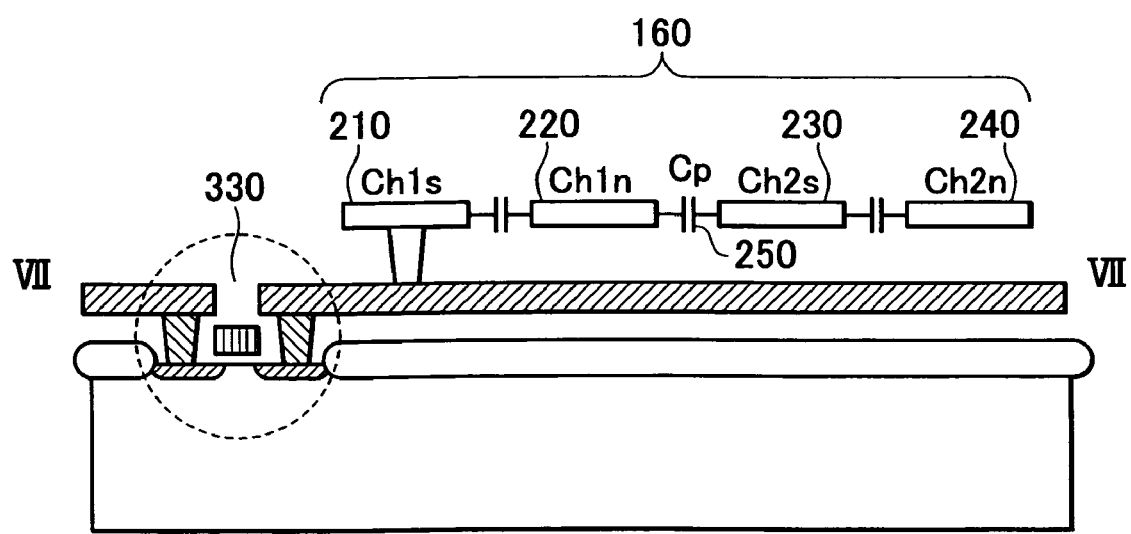
FIG. 7 is a diagram showing the longitudinal structure of a portion including common output lines taken along line VII-VII of FIG. 6 showing the known MOS sensor.
Figure 8:
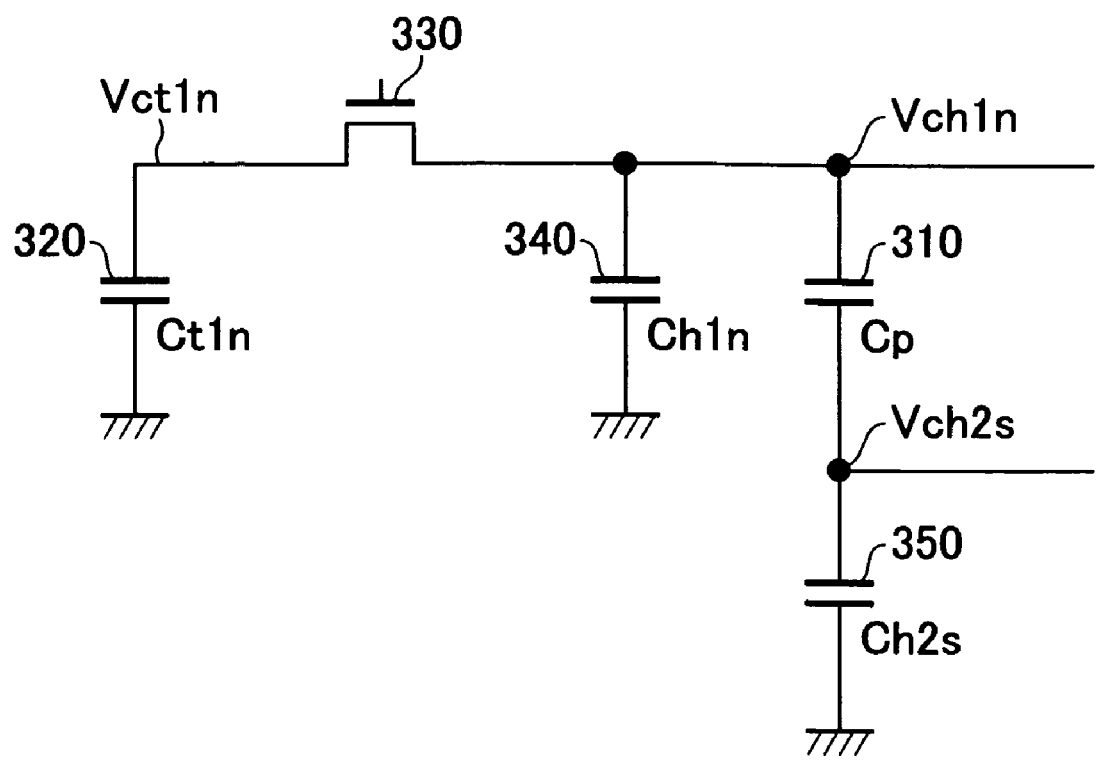
FIG. 8 is an equivalent circuit diagram of a portion of the common output lines of the known MOS sensor.

FIG. 1 is a block diagram showing the schematic configuration of a MOS sensor serving as a solid-state image sensor according to a first embodiment of the present invention. The same reference numerals are given to the same elements corresponding to those in FIG. 6. In the configuration shown in FIG. 1, the sequence of the second S output line 230 and the second N output line 240 is reversed from that of the configuration shown in FIG. 6.

This MOS sensor includes a sensor array 100 including a two-dimensional array of a plurality of pixel photosensor cells 110; a vertical shift register circuit 120 that sequentially selects one row from the sensor array 100; line memory circuits 130, each line memory circuit 130 including a signal charge holding capacitor Cts holding signal charge (S) and a reset level holding capacitor Ctn holding reset level (N) of the corresponding pixel photosensor cell 110 belonging to the selected row; a horizontal shift register circuit 140 that simultaneously selects two pieces of the signal data held in the line memory circuits 130, the signal data being associated with the selected one row, and transfers the selected two pieces of signal data to a first S output line 210 and a first N output line 220 and to a second S output line 230 and a second N output line 240, respectively; and first and second differential signal (S-N) read-out circuits 150 that amplify and output a first differential signal between an optical signal from the first S output line 210 and a noise signal from the first N output line 220 and a second differential signal between an optical signal from the second S output line 230 and a noise signal from the second N output line 240, respectively.

The first differential signal is output from an output terminal (out1) 170 of the first differential-signal read-out circuit 150, and the second differential signal is output from an output terminal (out2) 180 of the second differential-signal read-output circuit 150. The first S output line 210, the first N output line 220, the second S output line 230, and the second N output line 240 are included in common output lines 160.

In the MOS sensor shown in FIG. 1, which serves as the solid-state image sensor according to the first embodiment of the present invention, the signal read-out from each line memory circuit 130 to the common output lines 160 is carried out in accordance with a gain determined by a capacitance splitting ratio (Ct/(Ct+Ch)) between a hold capacitance Ct included in the line memory 130 and a capacitance Ch including a wiring capacitance between the common output lines 160 and, primarily, the ground, a capacitance between the source and the gate of a MOS switch connected to the common output lines 160, and a capacitance between the source and the backgate of the MOS switch. In other words, the signal charge (S) is read out at the optical-signal common output line in accordance with the gain determined by the capacitance splitting ratio; and the reset level (N) is read out at the noise-signal common output line in accordance with the gain determined by the capacitance splitting ratio. The differential signal between the signal charge (S) and the reset level (N) is output. This differential signal is expressed as A×(Vs×Cts/(Cts+Chs)−Vn×Ctn/(Ctn+Chn)) where A denotes the amplification factor of an amplifier; Vs denotes the optical signal level accumulated in the holding capacitor Cts; and Vn denotes the reset level accumulated in the holding capacitor Ctn.

Figure 2:
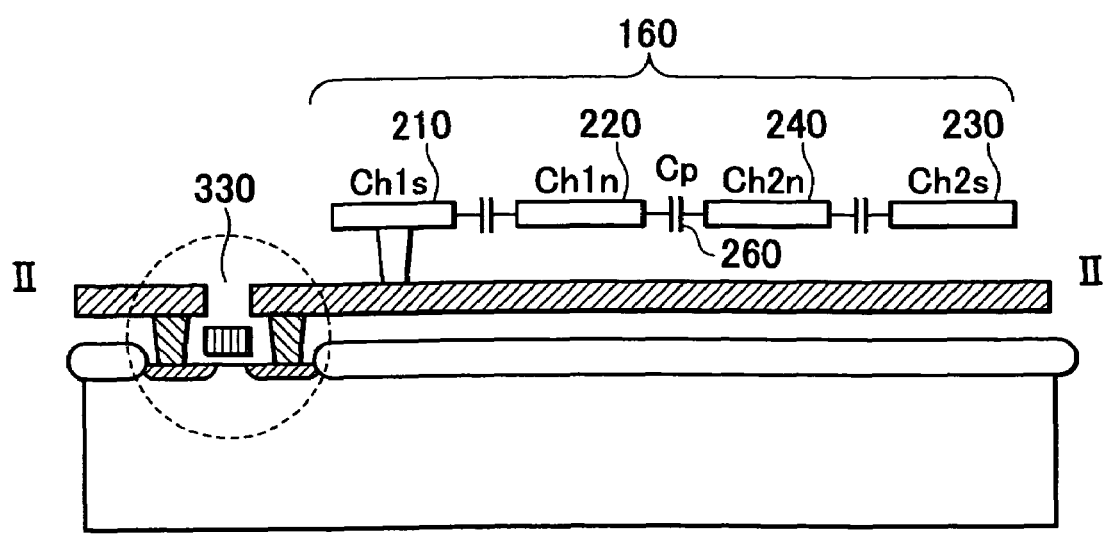
FIG. 2 is a diagram showing the longitudinal structure of a portion including common output lines taken along line II-II of FIG. 1.

FIG. 2 is a diagram showing the longitudinal structure of a portion including the common output lines 160 taken along line II-II of FIG. 1 showing the MOS sensor. The first S output line 210, the first N output line 220, the second S output line 230, and the second N output line 240 are arranged, as shown in FIG. 2, in the sequence: the first S output line 210, the first N output line 220, the second N output line 240, and the second S output line 230. Referring to FIG. 2, Ch1s denotes the first S output line capacitance; Ch1n denotes the first N output line capacitance; Ch2n denotes the second N output line capacitance; and Ch2s denotes the second S output line capacitance.

In the MOS sensor shown in FIGS. 1 and 2, the common output lines 160 are arranged in the sequence: the first S output line 210, the first N output line 220, the second N output line 240, and the second S output line 230. Due to a coupling capacitance Cp 260 formed between the first N output line 220 and the second N output line 240, crosstalk is induced between the S-N read-out circuits 150, which is estimated as:

$$Vout1 = A \times \left( \frac{Ct1s}{Ct1s + Ch1s} \times V1s - \left( \frac{Ct1n}{Ct1n + Ch1n} \times V1n + \alpha \times \frac{Ct2s}{Ct2s + Ch2s} \times V2s \right) \right) \quad (8)$$

$$= A \times \frac{Ct}{Ct+Ch} \times (V1s - (V1n + \alpha \times V2n))$$

$$Vout2 = A \times \left( \frac{Ct2s}{Ct2s + Ch2s} \times V2s - \left( \frac{Ct2n}{Ct2n + Ch2n} \times V2n + \alpha \times \frac{Ct1n}{Ct1n + Ch1n} \times V1n \right) \right)$$

$$= A \times \frac{Ct}{Ct+Ch} \times (V2s - (V2n + \alpha \times V1n))$$

The crosstalk between the S-N read-out circuits 150, generated by the coupling capacitance Cp 260 formed between the first N output line 220 and the second N output line 240, occurs in the same direction. In other words, equations (8) show that Vout1 induces crosstalk in the negative direction, which is expressed as $A \times (Ct/(Ct+Ch)) \times (-\alpha \times V2n)$, and Vout2 induces crosstalk in the negative direction, which is expressed as $A \times (Ct/(Ct+Ch)) \times (-\alpha \times V1n)$.

Since only crosstalk of the reset level is induced, the crosstalk is always constant ($\alpha \times Vn$) irrespective of the level of signal charge generated in each pixel photosensor cell 110. Since the overall offset ($\alpha \times Vn$) is small irrespective of the S-N read-out circuits 150, this offset can be compensated for easily.

According to the first embodiment of the present invention shown in FIG. 1, pieces of signal data held in the two line memory circuits 130 selected by the horizontal shift register circuit 140 are selected at different times by shifting the phase. Even when these pieces of signal data are combined by the subsequent signal processing and output via a single line generated by combining the two S-N read-out circuits 150, similar advantages are achieved. In other words, even when the outputs of the two S-N read-out circuits 150 are combined to form a single line, these outputs are out of phase with each other. Therefore, the signals never overlap with each other.

SECOND EMBODIMENT

Figure 3:
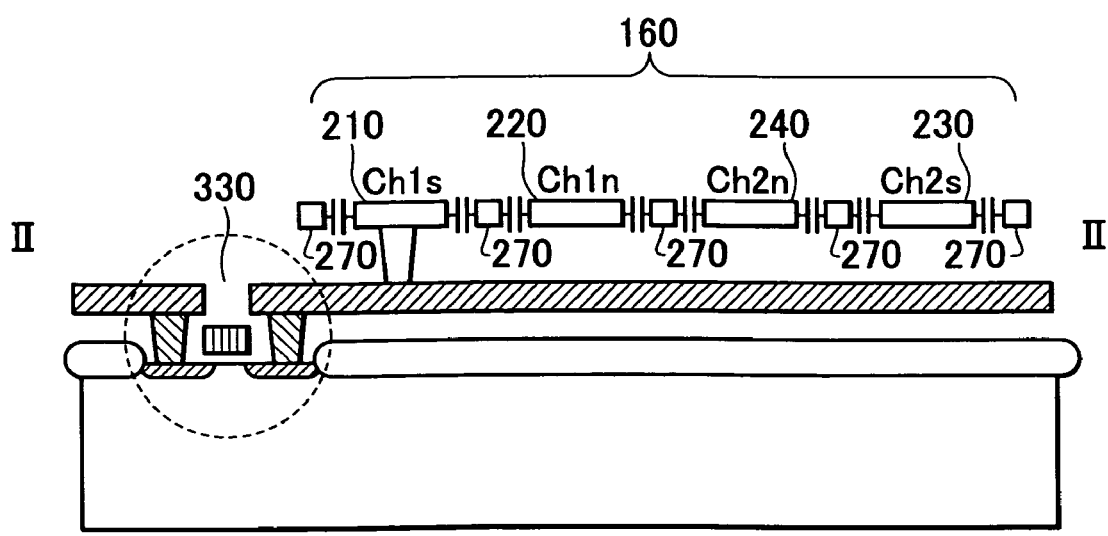
FIG. 3 is a diagram showing the longitudinal structure of the portion including the common output lines taken along line II-II of FIG. 1 according to a second embodiment of the present invention.

FIG. 3 is a diagram showing the longitudinal structure of the portion including the common output lines 160 taken along line II-II of FIG. 1 showing the MOS sensor serving as a solid-state image sensor according to a second embodiment of the present invention. The first S output line 210, the first N output line 220, the second S output line 230, and the second N output line 240 are arranged, as shown in FIG. 3, in the sequence: the first S output line 210, the first N output line 220, the second N output line 240, and the second S output line 230. Shield lines 270, to which a fixed potential, such as a ground potential, is supplied, are disposed between the common output lines 160.

According to the second embodiment of the present invention shown in FIG. 3, crosstalk is expected to be reduced by shielding, by the shield lines 270, faces of the common output lines 160 opposing each other, since these faces form the most influential coupling capacitances.

THIRD EMBODIMENT

Figure 4:
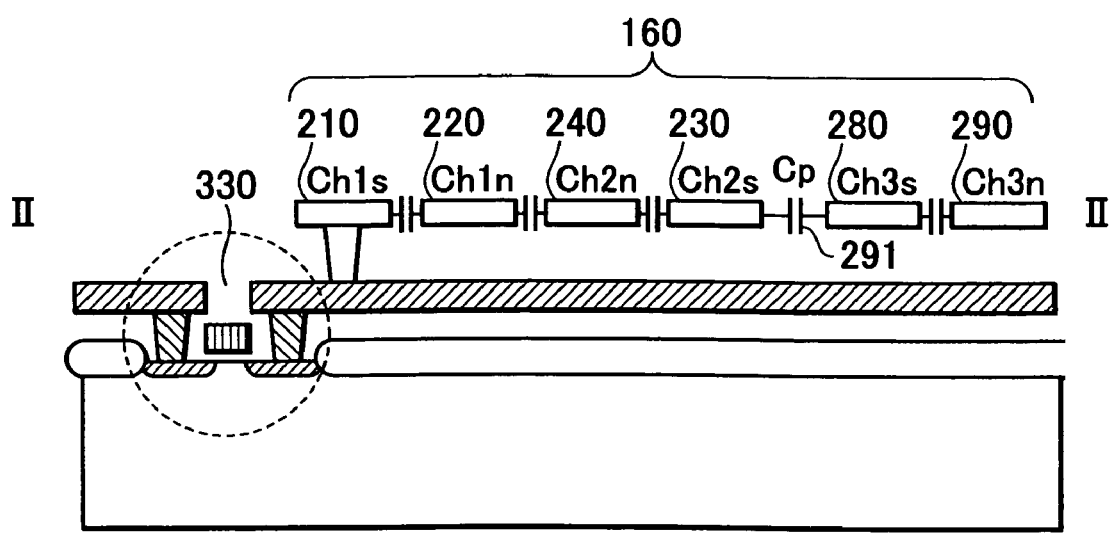
FIG. 4 is a diagram showing the longitudinal structure of the portion including the common output lines taken along line II-II of FIG. 1 according to a third embodiment of the present invention.

FIG. 4 is a diagram showing the longitudinal structure of the portion including the common output lines taken along line II-II of FIG. 1 showing the MOS sensor serving as a solid-state image sensor according to a third embodiment of the present invention. The first S output line 210, the first N output line 220, the second S output line 230, the second N output line 240, a third optical-signal common output line (hereinafter referred to as a third S output line) 280, and a third noise-signal common output line (hereinafter referred to as a third N output line) 290 are arranged, as shown in FIG. 4, in the sequence: the first S output line 210, the first N output line 220, the second N output line 240, the second S output line 230, the third S output line 280, and the third N output line 290.

The wiring distance between the second S output line 230 and the third S output line 280 is greater than that between the first S output line 210 and the first N output line 220, between the first N output line 220 and the second N output line 240, between the second N output line 240 and the second S output line 230, and between the third S output line 280 and the third N output line 290. Referring to FIG. 4, Ch3s denotes the capacitance of the third optical-signal common output line 280, and Ch3n denotes the capacitance of the third noise-signal common output line 290.

In the MOS sensor shown in FIG. 4, crosstalk between the S-N read-out circuits 150, generated by a coupling capacitance Cp 291 formed between the second S output line 230 and the third S output line 280, is estimated as:

$$Vout2 = A \times \left( \frac{Ct2s}{Ct2s + Ch2s} \times V2s + \alpha \times \frac{Ct3s}{Ct3s + Ch3s} \times V3s - \frac{Ct2n}{Ct2n + Ch2n} \times V2n \right) \quad (9)$$

$$= A \times \frac{Ct}{Ct + Ch} \times ((V2s + \alpha \times V3s) - V2n)$$

$$Vout3 = A \times \left( \frac{Ct3s}{Ct3s + Ch3s} \times V3s + \alpha \times \frac{Ct2s}{Ct2s + Ch2s} \times V2s - \frac{Ct3n}{Ct3n + Ch3n} \times V3n \right)$$

$$= A \times \frac{Ct}{Ct + Ch} \times ((V3s + \alpha \times V2s) - V3n)$$

The crosstalk between the S-N read-out circuits 150, generated by the coupling capacitance Cp 291 formed between the second S output line 230 and the third S output line 280, occurs in the same direction. Since the signal charge is injected into the other common output line, crosstalk of ($\alpha \times Vs$), which varies in accordance with the level of signal charge generated in each pixel photosensor cell 110, is induced.

According to the third embodiment of the present invention shown in FIG. 4, since the distance between the adjacent optical-signal common output lines is greater than each of the distances between the other lines, the absolute value of the coupling capacitance Cp 291 is reduced. Therefore, crosstalk is reduced.

Although the two-dimensional sensor including a sensor array of a plurality of lines of pixel photosensor cells has been described in the above-described embodiments, the present invention is applicable to a line sensor.

Although the number of common output lines is four in the above-described embodiments, the number of output lines may be 2n (n is a natural number greater than or equal to 2; i.e., n=2, 3, 4, . . . ).

FOURTH EMBODIMENT

Figure 5:
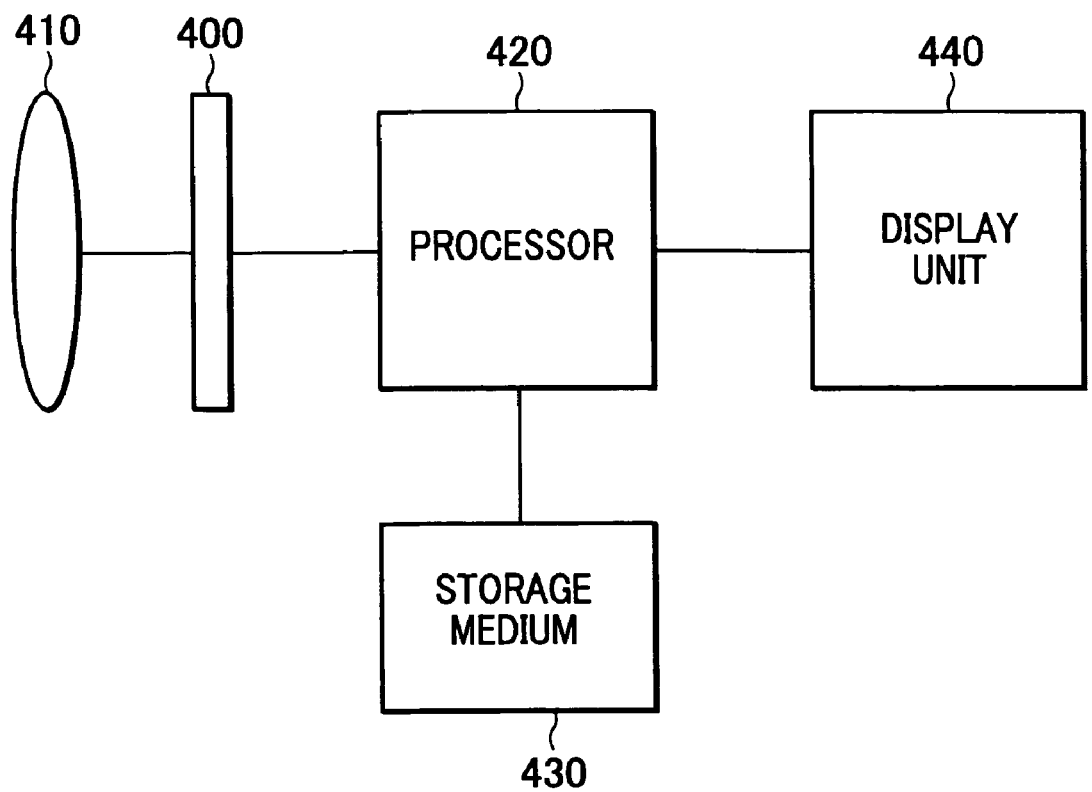
FIG. 5 is a diagram showing the schematic configuration of a camera including the solid-state image sensor shown in FIG. 1.

FIG. 5 is a diagram showing the schematic configuration of a camera including the solid-state image sensor shown in FIG. 1. This camera is generally referred to as an electronic camera, in contrast to a silver camera, and includes a still camera, a movie camera, or a camera including the functions of a still camera and a movie camera. The camera may be included in an information processing apparatus, such as a personal computer or a mobile terminal, to be part of the information processing apparatus.

An image of a subject is formed on a solid-state image sensor 400 by a fixed or replaceable lens unit 410. The output of the solid-state image sensor 400 is supplied to a processor (image processor) 420.

The processor 420 processes a signal (image) supplied by the solid-state image sensor 400 and supplies the processed signal to a display unit 440 or records the processed signal in a storage medium 430. The display unit 440 functions as an information supplier that displays various pieces of information related to image capturing and reading or as a viewfinder.

Typically, the camera includes an exposure adjusting function, a focusing function, and the like. Since these functions can be designed on the basis of commonly known technology, detailed descriptions thereof are omitted.

Referring to FIG. 9, a camera control system including the camera with the solid-state image sensor according to the present invention will now be described in detail.

FIG. 9 is a block diagram showing the schematic configuration of this camera control system. The camera control system includes a network 10 for digital-transmitting video data and camera control information (including status information). Video transmitting terminals 12 (12-1 to 12-*n*), the number of which is n, are connected to the network 10.

The video transmitting terminals 12 (12-1 to 12-*n*) are connected to video cameras 16 (16-1 to 16-*n*) via camera control units 14 (14-1 to 14-*n*), respectively. The camera control units 14 (14-1 to 14-*n*) control panning, tilting, zooming, focusing, and aperture of the video cameras 16 (16-1 to 16-*n*) connected thereto in accordance with control signals from the video cameras 16 (16-1 to 16-*n*), respectively.

The camera control units 14 (14-1 to 14-*n*) supply power to the video cameras 16 (16-1 to 16-*n*). The camera control units 14 (14-1 to 14-*n*) control power ON/OFF of the video cameras 16 (16-1 to 16-*n*) in accordance with external control signals.

Video receiving terminals 18 (18-1 to 18-*m*) that receive and display video information transmitted from the video transmitting terminals 12 (12-1 to 12-*n*) through the network 10 are connected to the network 10. The video receiving terminals 18 (18-1 to 18-*m*) are connected to monitors 20 (20-1 to 20-*m*), respectively, including bit map displays, CRT, etc.

The network 10 need not be wired and may be wireless using a wireless LAN or the like. In the latter case, each video receiving terminal 18 may be combined with the corresponding monitor 20 to become a mobile video receiving terminal. The video transmitting terminals 12 (12-1 to 12-*n*) compress video signals output from the corresponding video cameras 16 (16-1 to 16-*n*) connected thereto in a predetermined compression format, such as H.261, and transmit the compressed signals via the network 10 to the video receiving terminal(s) 18 having requested the video image or to all the video receiving terminals 18.

Each video receiving terminal 18 can control various parameters (image capturing direction, image capturing magnification, focusing, aperture, etc.) of the arbitrary video camera 16 via the corresponding video transmitting terminal 12 and the camera control unit 14 and control ON/OFF of the power supply. Each video transmitting terminal 12 may also be used as a video receiving terminal by connecting a monitor to the video transmitting terminal 12 and providing the video transmitting terminal 12 with a video decompression unit that decompresses the compressed video. In contrast, each video receiving terminal 18 may also be used as a video transmitting terminal by connecting the camera control unit 14 and the video camera 16 to the video receiving terminal 18 and providing the video receiving terminal 18 with a video compression unit. These terminals each include a ROM for storing necessary software for video transmission or video reception.

With this arrangement, each video transmitting terminal 12 transmits a video signal to the corresponding remote video receiving terminal 18 via the network 10 and, in response to a camera control signal transmitted from the video receiving terminal 18, controls panning, tilting, and the like of the corresponding video camera 16.

Each video receiving terminal 18 transmits a camera control signal to the corresponding video transmitting terminal 12. Having received the camera control signal, the video transmitting terminal 12 controls the corresponding video camera 16 in accordance with the details of the camera control signal and returns the current status of the video camera 16. The video receiving terminal 18 receives video data transmitted from the video transmitting terminal 12, performs predetermined processing of the video data, and displays, in real time, the captured video image on a display screen of the monitor 20.

Although the embodiments of the present invention have been described, the present invention is not limited to these embodiments and includes a camera including a solid-state image sensor and an information processing apparatus including a solid-state image sensor.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid-state image sensor for outputting, from one line of a sensor array including an array of pixel photosensor cells or from one of a plurality of lines, which is selected in sequence from the sensor array including the array of the pixel photosensor cells, an optical signal and a noise signal from each of the pixel photosensor cells, n optical signal common output lines and n noise-signal common output lines (where n is a natural number greater than or equal to 2);

means for separately reading out the output optical signals and the noise signals at the n optical-signal common output lines and the n noise-signal common output lines; and n differential output means for outputting differential signals between the optical signals and the noise signals output from the corresponding pixel photosensor cells, respectively, to which the optical-signal common output lines and the noise-signal common output lines are connected, the n differential output means including first differential output means and second differential output means, wherein the n optical-signal common output lines and the n noise-signal common output lines are arranged parallel to each other, and, of the n optical-signal common output lines and the n noise-signal common output lines, a first optical-signal common output line, a first noise-signal common output line, a second optical-signal common output line, and a second noise-signal common output line are arranged in the sequence of the first optical-signal common output line, the first noise-signal common output line, the second noise-signal common output line, and the second optical-signal common output line, and wherein the first optical-signal common output line and the first noise-signal common output line are connected to the first differential output means, and the second optical-signal common output line and the second noise-signal common output line are connected to the second differential output means.

2. A solid-state image sensor according to claim 1, wherein a shield line to which a fixed potential is supplied is arranged in a same layer as the optical signal common output lines and the n noise-signal common output lines, wherein, of the n optical-signal common output lines and the n noise-signal common output lines, the shield line is arranged between adjacent ones of the noise-signal common output lines, between adjacent ones of the optical-signal common output and the noise-signal common output lines, or outside of the n optical-signal common output lines and the n noise-signal common output lines.

3. A solid-state image sensor according to claim 1, wherein n is 2, and a shield line to which a fixed potential is supplied is arranged in a same layer as the first optical-signal common output line, the first noise-signal common output line, the second optical-signal common output line, and the second noise-signal common output line, the shield line being arranged between the first noise-signal common output line and the second noise-signal common output line, between the first optical-signal common output line and the first noise-signal common output line, between the second noise-signal common output line and the second optical-signal common output line, or outside of the first optical-signal common output line and the second optical-signal common output line.

4. A solid-state image sensor according to claim 1, wherein n is greater than or equal to 3, and an optical-signal common output line is arranged adjacent to at least one side of a section including the first optical-signal common output line, the first noise-signal common output line, the second noise-signal common output line, and the second optical-signal common output line, which are arranged in this sequence, and the distance between the optical-signal common output line arranged adjacent to the section and the first or second optical-signal common output line included in the section is greater than the distance between the optical-signal and the noise-signal common output lines included in the section.

5. A solid-state image sensor according to claim 1, wherein read out timing of the optical signal and the noise signal at the first optical-signal common output line and the first noise-signal common output line connected to the first differential output means of the n differential output means is made to differ from that at the second optical-signal common output line and the second noise-signal common output line connected to the second differential output means adjacent to the first differential output means by shifting the phase between the first differential output means and the second differential output means.

6. A solid-state image sensor according to claim 1, wherein the optical signal and the noise signal from each of the pixel photosensor cells of the selected line are held in an optical-signal holding capacitor and a noise-signal holding capacitor; and the optical signals and the noise signals associated with one row, which are held in the optical-signal holding capacitors and the noise-signal holding capacitors, are separately read out, via a transfer switch, at the n optical-signal common output lines and the n noise signal common output lines, respectively.

7. A camera comprising a solid-state image sensor as set forth in claim 1 and a processor that processes an image captured by the solid-state image sensor.

8. A camera control system comprising a solid-state image sensor as set forth in claim 1 and a processor that processes an image captured by the solid-state image sensor.

9. A signal output device for outputting, from each of a plurality of signal sources, a first signal and a second signal that has a level lower than that of the first signal, comprising:

n first-signal common output lines and n second-signal common output lines (where n is a natural number greater than or equal to 2);

means for separately reading out first signals and second signals at the n first-signal common output lines and the n second-signal common output lines; and n differential output means for outputting differential signals between the first signals and the second signals output from corresponding signal sources, respectively, to which the first-signal common output lines and the second-signal common output lines are connected, the n differential output means including first differential output means and second differential output means, wherein the n first-signal common output lines and the n second-signal common output lines are arranged parallel to each other, and, of the n first-signal common output lines and the n second-signal common output lines, at least four common output lines consisting of a first first-signal common output line, a first second-signal common output line, a second first-signal common output line, and a second second-signal common output line are arranged in the sequence: the first first-signal common output line, the first second-signal common output line, the second second-signal common output line, and the second first-signal common output line, and wherein the first first-signal common output line and the first second-signal common output line are connected to the first differential output means, and the second first-signal common output line and the second second-signal common output line are connected to the second differential output means.

10. A method of outputting from each of a plurality of signal sources, a first signal and a second signal having a level lower than a level of the first signal, comprising the steps of:

separately reading out the first signals and the second signals at n first-signal common output lines and n second-signal common output lines (where n is a natural number greater than or equal to 2); and outputting differential signals between the first signals and the second signals output from the corresponding signal sources by n differential output means, respectively, to which the first-signal common output lines and the second-signal common output lines are connected, the differential output means including first differential output means and second differential output means, wherein the n first-signal common output lines and the n second-signal common output lines are arranged parallel to each other, and, of the n first-signal common output lines and the n second-signal common output lines, at least four common output lines consisting of a first first-signal common output line, a first second-signal common output line, a second first-signal common output line, and a second second-signal common output line are arranged in the sequence: the first first-signal common output line, the first second-signal common output line, the second second-signal common output line, and the second first-signal common output line, and wherein the first first-signal common output line and the first second-signal common output line are connected to the first differential output means, and the second first-signal common output line and the second second-signal common output line are connected to the second differential output means.

11. A solid-state image sensor comprising:

a sensor array including an array of pixel photosensor cells;

a plurality of optical-signal common output lines and noise-signal common output lines, including a first optical-signal common output line, a second optical-signal common output line, a first noise-signal common output line, and a second noise-signal common output line; and a plurality of differential output means, each outputting differential signals between signals which derive from the optical-signals and the noise-signals output from the corresponding pixel photosensor cells, and including first and second differential output means, wherein the common output lines are arranged in parallel in the sequence of the first optical-signal common output line, the first noise-signal common output line, the second noise-signal common output line, and the second optical-signal common output line, the first optical-signal common output line and the first noise-signal common output line are connected to the first differential output means, and the second optical-signal common output line and the second noise-signal common output line are connected to the second differential output means.

12. A signal output device comprising:

a first signal source and a second signal source, each outputting a first signal and a second signal;

a first signal line to which a first signal deriving from said first signal source is output; a second signal line to which a second signal deriving from said first signal source is output;

a third signal line to which a second signal deriving from said second signal source is output;

a fourth signal line to which a first signal deriving from said second signal source is output;

first differential output means to which said first signal line and said second signal line are connected, and which outputs a differential signal between the first signal and the second signal deriving from said first signal source; and second differential output means to which said third signal line and said fourth signal line are connected, and which outputs a differential signal between the first signal and the second signal deriving from said second signal source, wherein said signal lines are arranged in parallel in the sequence of said first signal line, said second signal line, said third signal line, and said fourth signal line, and the signal levels of the second signals are lower than that of the first signals.

\* \* \* \* \*

UNITED STATES PATENT AND TRADEMARK OFFICE
CERTIFICATE OF CORRECTION

PATENT NO. : 7,286,170 B2  Page 1 of 1
APPLICATION NO. : 10/693455
DATED : October 23, 2007
INVENTOR(S) : Fumihiro Inui et al.

It is certified that error appears in the above-identified patent and that said Letters Patent is hereby corrected as shown below:

COLUMN 4
Line 25, "A×(" should read --A×((--.

COLUMN 6
Line 46, "solid-stage" should read --solid-state--.
Line 48, "solid-stage" should read --solid-state--.

COLUMN 16
Line 11, "a" should begin a new paragraph.

Signed and Sealed this

Sixth Day of January, 2009

JON W. DUDAS
*Director of the United States Patent and Trademark Office*